United States Patent [19]

Groeseneken et al.

[11] Patent Number: 5,036,273
[45] Date of Patent: Jul. 30, 1991

[54] SYSTEM OF MEASURING A STATE DENSITY IN A SEMI-CONDUCTOR ELEMENT AND A METHOD USING THIS SYSTEM

[75] Inventors: Guido V. L. Groeseneken, Leuven; Herman E. M. Maes, Bierbeek, both of Belgium

[73] Assignee: Interuniversitair Micro-Elektronica Centrum, Leuven-Heverlee, Belgium

[21] Appl. No.: 252,130

[22] Filed: Oct. 3, 1988

[30] Foreign Application Priority Data

Oct. 5, 1987 [NL] Netherlands ............... 8702373

[51] Int. Cl.$^5$ .................................... G01R 31/26
[52] U.S. Cl. ........................... 324/158 T; 324/158 D
[58] Field of Search ............ 324/158 D, 158 T, 158 R

[56] References Cited

U.S. PATENT DOCUMENTS

| | | |
|---|---|---|
| 3,636,450 | 12/1969 | Griffin . |
| 4,323,842 | 4/1980 | McGarrity et al. . |
| 4,409,676 | 10/1983 | Varshney ................. 324/158 T |
| 4,581,576 | 4/1986 | Wang ..................... 324/158 D |

FOREIGN PATENT DOCUMENTS

| | | |
|---|---|---|
| 0041858 | 12/1981 | European Pat. Off. . |
| 0047141 | 3/1982 | European Pat. Off. . |
| 0117259 | 9/1984 | European Pat. Off. . |
| 3037192 | 4/1980 | Fed. Rep. of Germany . |
| 1014829 | 12/1965 | United Kingdom . |

OTHER PUBLICATIONS

1983 American Institute of Physics; "Electron Trapping in Thin Films of Thermal LiO$_2$ at Temperatures Between 30 and 300 K"; pp. 1930–1936.
1983 Electronique Applications; "Mesure Automatique des Capacites MOS", pp. 61–65.
Elliot; *The Case of Charge Pumping Currents to Measure Surface State Densities in MOS Transistors*; Solid State Electronics; 1976; vol. 19, pp. 241–247.
DeCleroq & Jespers; Analysis of Interface Properties in MOS Transistors by Means of Charge Pumping Measurements, Revue HF; vol. 9, pp. 244–253.
Borsuk & Swanson; Current Transient Spectroscopy: A High Sensitivity DLTS System; IEEE Transactions on Electron Devices; vol. ED–27, No. 12; 12/80, pp. 2217–2225.
Petit et al; Mescire Automatique des Capacites MOS; Electronique Applicatores No 28; pp. 61–65.
Itsumi; Electron Trapping in Third Figure of Thermal SiO$_2$ at Temperatures Between 30 and 300 K; J. Appl. Phys. 54(4), Apr. 1983; pp. 1930–1936.
Backensto & Viswanathan; Measurement of Interface State Characteristics of MOS Transistor Utilizing Change-Pumping Techniques, IEEE Proc.; vol. 128, No. 2, pp. 44–54.
Day, Tsai & Streetman; "Deep-Level-Transient Spectroscopy: System Effects and Data Analysis"; J. Appl. Phys. 50(8), Aug. 1979; pp. 5093–5098.
Brugler & Jespers; "Charge Pumping in MOS Devices"; IEEE Transactions on Electron Devices, vol. ED–16, No. 3; Mar. 1969.
Wessels; Determination of Deep Levels in Cu–Doped Gap Using Transient-Current Spectroscopy; Journal of Applied Physics; vol. 47, No. 3, Mar. 1976.
Lang; "Deep-Level Transient Spectroscopy: A New Method to Characterize Traps in Ssemiconductors", Journal of Applied Physics, vol. 45, No. 7, Jul. 1974.

*Primary Examiner*—Ernest F. Karlsen
*Attorney, Agent, or Firm*—Watson, Cole, Grindle & Watson

[57] ABSTRACT

A system of measuring a state density in a semi-conductor element and a method using this system. The system measuring a state density in a semi-conductor element comprises a pulse generator and a control unit for controlling size and shape of the pulses, such as to be able to measure state densities in the band gap of the semiconductor element.

5 Claims, 3 Drawing Sheets

SYSTEM OF MEASURING A STATE DENSITY IN A SEMI-CONDUCTOR ELEMENT AND A METHOD USING THIS SYSTEM

BACKGROUND

The present invention relates to a measuring system for one or more semi-conductor elements, which can easily be used in practice, as measurements to semi-conductor elements can be made with high rates. Standard available measuring and controlling units are preferably used, such that maintenance and service costs will be reduced. High measuring rates are required for testing of degradation of non-volatile memories (e.g. NMOS, FLOTOX, etc.), if testing is to be executed on site.

RELATED ART

As prior art the following publications are known:
EP-A-0 117 259;
J. Appl. Phys. 45, pag. 3023–3032, 1974;
J. Appl. Phys. 47, pag. 1131–1133, 1976;
IEEE Trans. Electron. Dev. ED-27, pag. 2217–2225, 1980;
IEEE Trans. Nulc. Sci. NS-23, 1976;
J. Appl. Phys. 50, pag 5093–5096, 1979;
IEEE Trans. El. Dev., vol. ED-16, pag. 297, 1969;
the European application No. 81302531.9;
Rev. Acta Techn. Belgica, vol. 9, pag. 244, 1974;
Sol. State Electr., vol. 19, pag. 241, 1976;
Proc. IEE, vol. 128, pt. 1, nr. 2, pag. 44, 1981;
Electronique Appl. no. 28, pag. 61–65, 1983;
DE, Al, 3037192, pag. 5, 1982;
GB-A-1014829, pag. 3, 1965;
Journal of Applied Physics, vol. 54, no. 4, pag. 1930–1936, 1983;
U.S. Pat. No. 3,636,450, Jan. 18, 1972;
U.S. Pat. No. 4,323,842, Apr. 6, 1982

The inventor of the present invention analysed phenomena existing in such known system; this study is published in IEEE Transactions on Electron Devices vol. ED-31, nr. 1, January 1984.

SUMMARY OF THE INVENTION

It is an object of the present invention to improve upon the known systems.

The system and method according to the present invention also provides such accurate results, that further study of phenomena in semi-conductor elements, like 1/f-noise, a further understanding of interfaces, also under manufacturing conditions, will be accomplished. The controlling unit can adjust size (amplitude, frequency and shape of the pulses). By two pulse trains having different rising and falling edges a window of desired width is achieved at a certain energy value in the band gap between conduction and valence band. The difference of direct current part (DC) of the current generated by different pulse trains, as measured by the electrometer, establishes a direct measure of the number of existing density states inside this window, or irregularity or lattice errors in the semi-conductor material. Therefor, by moving said window, spectroscopic measurements through the band gap are possible.

The measuring system makes it possible to scan the band gap of the semi-conductor material over the entire width, viz. from the conducting band to the valence band. At low temperatures (e.g. below 100K), the width of said window is further decreased. Accounting with the temperature dependency of thermal emission rate of electrons and holes and of the intrinsic concentration, the effective capture cross section of electrons and holes can be measured directly.

BRIEF DESCRIPTION OF THE DRAWINGS

Further features, details and advantages of the present invention will become clear at reading the following descriptions, referring to the annexed drawing, in which show.

DETAILED DESCRIPTION

Figure 1:
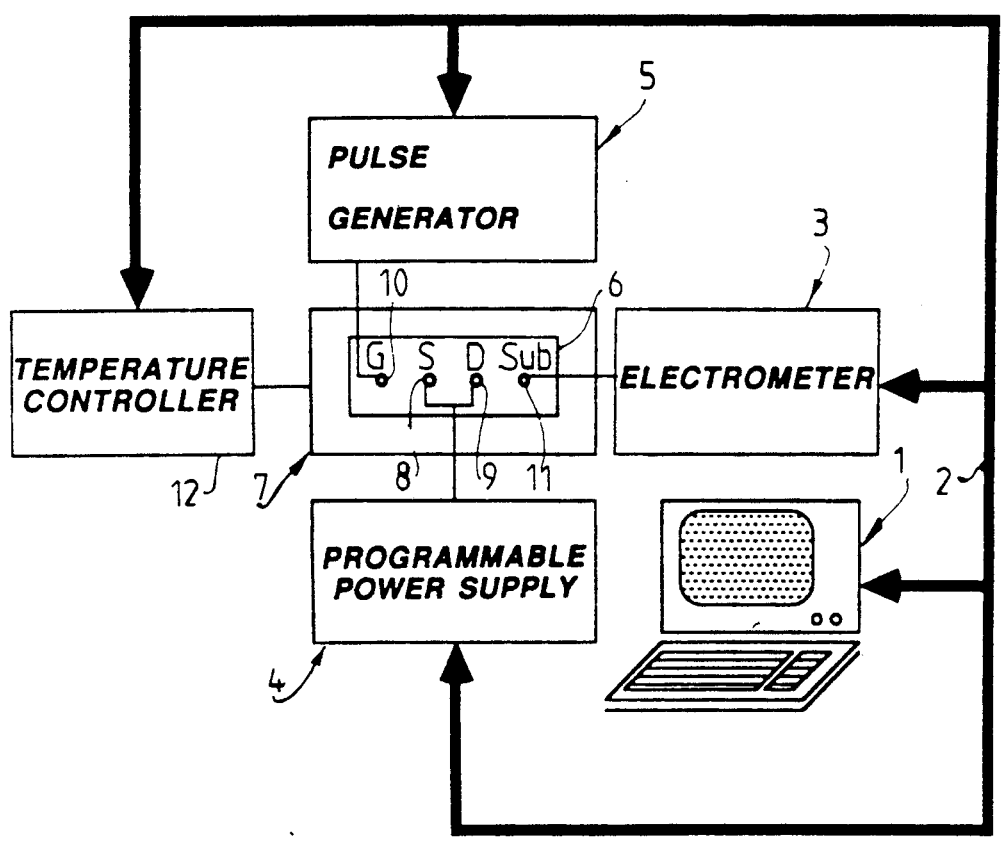
FIG. 1 a diagram of a system according to the present invention for implementation of the method according to the present invention.

A control unit, e.g. a personal computer, is connected to a programmable electrometer 3, e.g. of the type Keithley ® 617, through a parallel IEEE-bus 2, and also to a programmable supply source 4 and a programmable pulse generator 5, e.g. the type Hewlett Packard ® 8112.

A semi-conductor element 6 is arranged into a sample holder 7 of a not shown refrigerator or cryostat, which sample holder will be kept under a constant temperature, at least temporarily. In the shown embodiment the semi-conductor element is a MOS-transistor and source and drain thereof, 8,9 resp., are connected to a supply source 4, the pulse generator 5 is connected to the gate 10 and the electrometer 3 is connected to a substrate terminal 11.

Between substrate at one side and source and drain at the other side, a constant voltage will be commonly supplied, such as to set the Fermi-level in the channel. The constant voltage can have different values at different measurements.

The controlling unit 1 controls the electrometer 3, the power supply source 4 and the pulse generator 5 by means of computer program, of which the algorithm will be described hereafter.

It is found that at a certain temperature the logarithm of a quotient of different fall and rise time resp. of the pulse provides a window or energy region determined by those different times, of energy levels in the upper part and lower part resp. of the energy band gap in the semi-conductor element.

By varying (through the control unit 1) of rise and fall times of pulses applied at the gate of the MOS-transistor, the number of (interface or surface) state density and capture cross sections of holes and electrons can be measured inside an energy region thus chosen. The charge or current measured by the electrometer is a direct measure of those quantities.

In the embodiment of the present invention of FIG. 1 the sample holder 7 is part of a refrigerator or cryostat, in which the temperature is controlled by a temperature controller 12 as such controlled by the control unit 1 through the IEEE-bus, which controller is capable of varying the temperature inside the cryostat between 10K and 400K. By varying the temperature in the cryostat the energy area in the band gap, in which measurements are being made, can further be decreased and measurements can be made close to the conduction band or valence band.

It is also found that the width of the window firstly set by the control unit and the level in the band gap are varied by variation of the absolute temperature (in Kelvin (K)).

Looking at the flow diagram of the algorithm for measurements at a semi-conductor element 6 the user of the measuring system brings into the computer 1 the amplitudes of the pulse and frequency thereof, the setting of the temperature in the cryostat and the value of the voltage to be supplied to the substrate (20). The measuring automatically sets the temperature (21), the pulse amplitude and frequency thereof (22) and the fall time (23). After the current through the substrate $I_{sub}$ is measured by the electrometer (24), the fall time is changed automatically (25), if required in the measuring process, the rise time of the pulse automatically set (26), the substrate current $I_{sub}$ measured by means of the electrometer 3 (27), the rise time automatically changed (28), if required, and the temperature in the sample or container 7 automatically changed, if required.

The measured spectrum, as requested from the control unit 1 and measured automatically, is visualized (30) or printed on paper.

Figure 2:
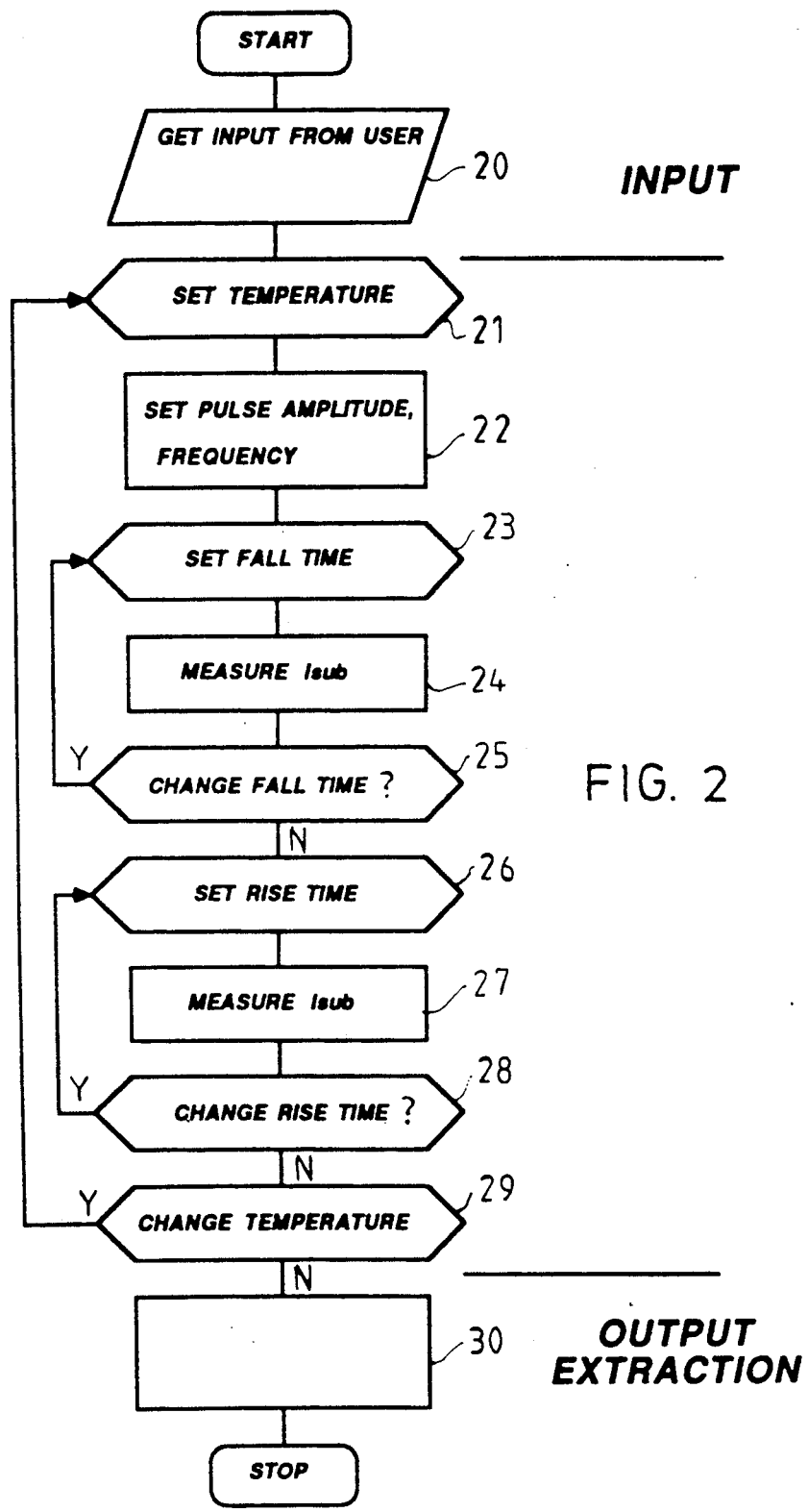
FIG. 2 an algorithm for implementation of the method of FIG. 1.

The algorithm shown in FIG. 2, provides such variation of temperature existing in the cryostat, and of rise and fall times of the pulses, that a regular scanning of the band gap takes place, maintaining a substantially constant width of the window.

Figure 3:
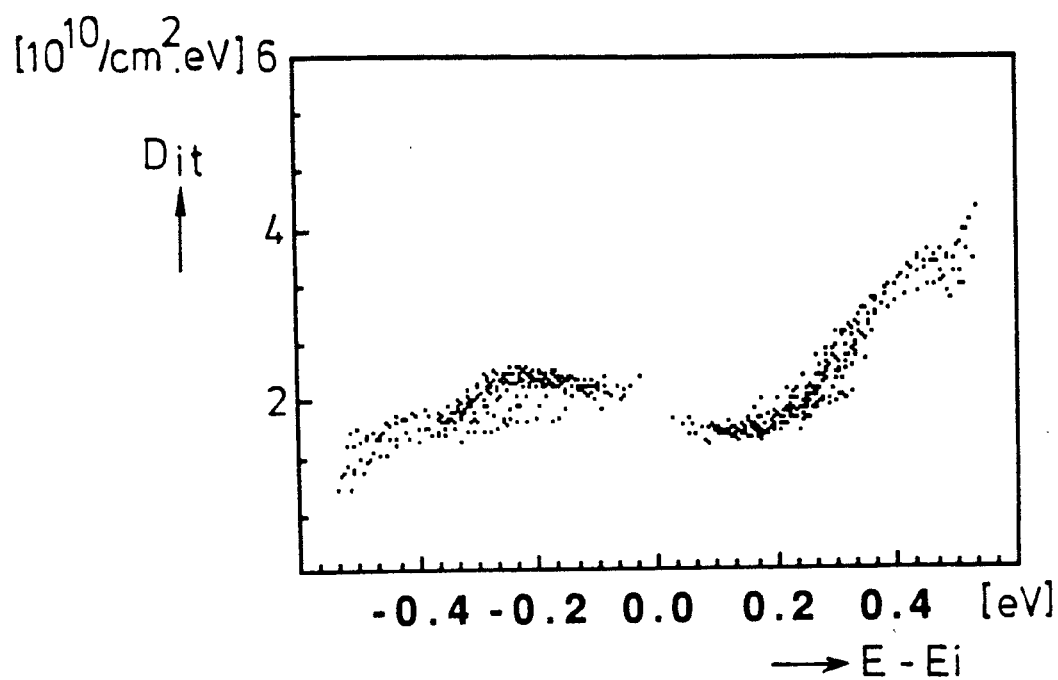
FIG. 3 a graph of a first testing measurement according to the present invention.

First measurements according to the method and system of the present invention is shown in FIG. 3, in which the state densisty $D_{it}$ is shown as function of the energy E relative to the centre $E_i$ of the band gap. The temperature is changed from 77K to 400K in steps of 10K. The rise time (for the upper half of the band gap) and the fall time (for the lower half of the band gap) were both changed.

It is noted that the state density is high in the upper part of the band gap, contrary to a relatively constant value in the lower part of the band gap.

We claim:

1. A system of measuring state density in a semi-conductor element, e.g. a MOS-transistor, provided with connecting terminals, comprising:
    a pulse generator for generating pulses to be applied to the connecting terminals;
    an electrometer for measuring change induced in the semi-conductor element by said pulses;
    a control unit to control the size and shape of said pulses and in which a charge value measured by said electrometer is convertible by said control unit into a measure of the state density of said semi-conductor element.

2. A measuring system according to claim 1, in which said controlling unit, said electrometer and said pulse generator are connectable to a common IEEE-bus, preferably parallel IEEE-bus.

3. Measuring system according to claim 2 in which said semi-conductor element is a MOS-transistor, provided with gate, source, drain and substrate connecting electrodes, in which said substrate connecting terminal is to be connected to the electrometer, said pulse generator is connected to said gate-terminal and said source and drain terminals are to be connected to a programmable voltage supply unit, to be connected to said control unit, in which a voltage defined by said control unit is to be applied to source and drain of the MOS-transistor and in which the density of states at the interface between gate and channel of the MOS-transistor and/or the effective capture diameters of gates and/or electrons is determined.

4. Measuring system according to claim 1 in which said semi-conductor element is a MOS-transistor, provided with gate, source, drain and substrate connecting electrodes, in which said substrate connecting terminal is to be connected to the electrometer, said pulse generator is connected to said gate-terminal and said source and drain terminals are to be connected to a programmable voltage supply unit, to be connected to said control unit, in which a voltage defined by said control unit is to be applied to source and drain of the MOS-transistor and in which the density of states at the interface between gate and channel of the MOS-transistor and/or the effective capture diameters of gates and/or electrons is determined.

5. A method for measuring the state density in a semi-conductor element, e.g. a MOS-transistor, provided with connecting terminals, comprising:
    generating pulses and applying them to the connecting terminals;
    controlling the unit size and shape of the pulses;
    measuring the charge induced in the semi-conductor element by said pulses and converting the measured charge into a measure of density state; and
    controlling the temperature of the semi-conductor element.

* * * * *